United States Patent [19]

Ikoma et al.

[11] Patent Number: 4,618,780
[45] Date of Patent: Oct. 21, 1986

[54] POWER-OFF DETECTION CIRCUIT FOR AN ELECTRONIC APPARATUS

[75] Inventors: Keiichi Ikoma, Nara; Syuji Katayama, Yamatokoriyama, both of Japan

[73] Assignee: Sharp Kabushiki Kaisha, Osaka, Japan

[21] Appl. No.: 573,645

[22] Filed: Jan. 25, 1984

[30] Foreign Application Priority Data

Feb. 8, 1983 [JP] Japan ............................ 58-18834[U]

[51] Int. Cl.[4] ............................................ G01R 17/02
[52] U.S. Cl. ....................................... 307/130; 361/92
[58] Field of Search ............... 307/116, 125, 126, 130, 307/140, 530, 362; 361/92, 187, 88

[56] References Cited

U.S. PATENT DOCUMENTS

| 3,648,145 | 3/1972 | Meyer et al. | 361/187 X |
|---|---|---|---|
| 4,172,980 | 10/1979 | Hsieh et al. | 307/116 X |
| 4,203,059 | 5/1980 | Kraus | 307/140 X |
| 4,415,943 | 11/1983 | Wortman | 361/92 X |
| 4,429,236 | 1/1984 | Nitschke | 307/362 |
| 4,439,805 | 3/1984 | Tarleton | 361/187 X |

OTHER PUBLICATIONS

Dye, "Electronic Power Control Interface", IBM Technical Disclosure Bulletin, vol. 21, No. 5, Oct. 1978, pp. 2062, 2063.

Primary Examiner—A. D. Pellinen
Assistant Examiner—Derek S. Jennings
Attorney, Agent, or Firm—Birch, Stewart, Kolasch & Birch

[57] ABSTRACT

An electronic apparatus including a circuit generating a control signal activating at least one heavy load includes a voltage comparision circuit for comparing a power source proportional voltage with a reference voltage and outputting a power-off signal when the level of the power source proportional voltage is smaller than that of the reference voltage, and a power-off detection circuit responsive to the power-off signal of the comparision circuit for detecting the level of the control signal associated with the at least one heavy load and detecting a power-off condition of the electronic apparatus.

14 Claims, 4 Drawing Figures

POWER-OFF DETECTION CIRCUIT FOR AN ELECTRONIC APPARATUS

BACKGROUND OF THE INVENTION

The present invention relates to a power-off detection circuit for generating a power-off signal before a supply voltage completely changes to 0 V in the power-off state of an electronic apparatus.

A conventional typical power-off detection circuit is shown in FIG. 1 and comprises resistors R1 and R2, and a comparison circuit CMP. A supply voltage VP is divided by the resistors R1 and R2 to obtain a power source proportional voltage a, and the power source proportional voltage a is inputted in the comparison circuit CMP. Also, the comparison circuit CMP receives a reference voltage Vref showing a level somewhat lower than the supply voltage VP.

The power source proportional voltage a is compared with the reference voltage Vref by the comparison circuit CMP. When the power source proportional voltage a is lower than the reference voltage Vref, a power-off signal $\overline{P}$ is generated and outputted.

Recently, due to the miniaturization and lightening of the typical electronic apparatus, the power source capacity of many typical apparatus is reduced.

However, in the case where the power source capacity is reduced, it is possible that the above power-off detection circuit may generate and output the power-off signal $\overline{P}$ even when the power is set ON. For example, in the case where the power source capacity is not sufficiently great and when a control signal S is generated and outputted toward a comparatively heavy load in the electronic apparatus as shown in FIG. 2, the supply voltage VP decreases temporarily.

The level of the power source proportional voltage a divided by the decreased supply voltage VP is lower than that of the reference voltage Vref, and the power-off signal $\overline{P}$ is generated and outputted.

Accordingly, when the above power-off detection circuit is used in an electronic apparatus having a heavy load such as solenoid of the like, the power source capacity must be made larger than necessary.

SUMMARY OF THE INVENTION

In view of the above disadvantages of the conventional device, an object of the present invention is to provide a power-off detection circuit which correctly operates even when a heavy load is driven by a source having a small power capacity.

Another object of the present invention is to provide a power-off detection circuit which prohibits the generation of a power-off signal by detecting the start of the driving of a heavy load.

Other objects and further scope of the applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

According to an embodiment of the present invention, an electronic apparatus having means for generating a control signal activating at least one heavy load comprises a voltage comparison means for comparing a power source proportional voltage with a reference voltage and outputting a power-off signal when the level of the power source proportional voltage is smaller than that of the reference voltage, and a power-off detection means responsive to the power-off signal of the commparison circuit for detecting the level of the control signal for the at least one heavy load and detecting a power-off condition of the electronic apparatus. The electronic apparatus further comprises voltage output means for outputting the power source proportional voltage derived by dividing the supply voltage by a ratio. Also, the power-off detection means for inhibiting further comprises prohibiting means the output of the power-off signal when the level of the control signal is high. When the output of the power-off signal is prohibited by the prohibiting means, the ratio is increased, or the level of the reference voltage is decreased.

In the above embodiment, when a plurality of heavy loads are provided and a plurality of control signals are generated, the power-off detection means comprises an OR circuit mens for calculating the logical sum of the levels of each of the plurality of control signals for the plurality of heavy loads, and a prohibition means for prohibiting the output of the power-off signal when the OR circuit means outputs a high level signal.

According to the present invention, a power-off detection circuit comprises a comparison circuit for comparing a power source proportional voltage with a reference voltage, an OR circuit means for calculating the logical sum of control signals of all heavy loads in an electronic apparatus, a comparison voltage level changing circuit for prohibiting the output of a power-off signal from the comparison circuit by increasing a division ratio of the power source proportional voltage to a supply voltage, or by decreasing the level of reference voltage only by a predetermined level. That is, when the heavy load is driven, the division ratio of the power source proportional voltage to the supply voltage is increased, or the reference voltage is decreased with the predetermined level, so that the level of the power source proportional voltage does not become smaller than that of the reference voltage.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 1:
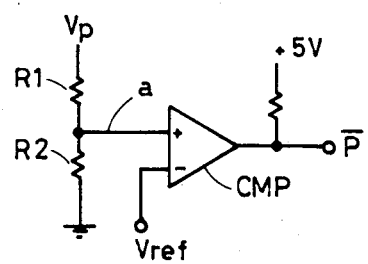
FIG. 1 shows a circuit diagram of the conventional typical power-off detection circuit.
Figure 2:
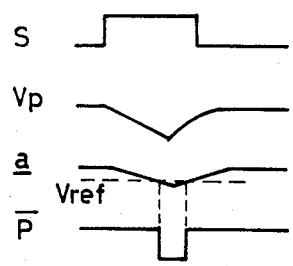
FIG. 2 shows a wave form chart of FIG. 1.
Figure 3:
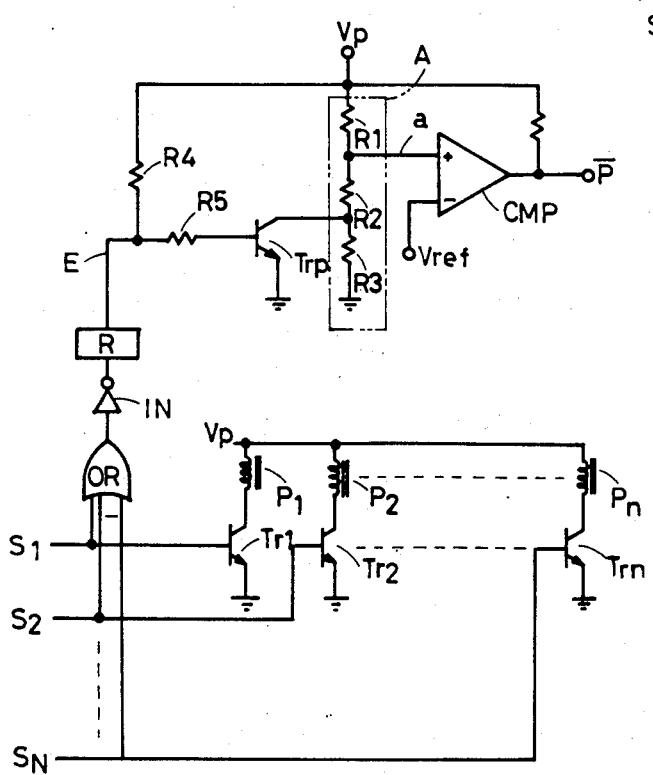
FIG. 3 shows a circuit diagram of a power-off detection circuit according to an embodiment of the present invention.

Referring now to FIG. 3, there is illustrated a circuit diagram of a power-off detection circuit of the present invention utilizing in an electronic apparatus having a heavy load such as a solenoid or the like.

Solenoids P1-Pn are connected with a supply voltage VP, and driven and controlled by transistors Tr1-Trn.

The ON-OFF control of the transistors Tr1-Trn are enabled by control signals S1-Sn, respectively. Further, the control signals S1-Sn are inputted to an OR circuit, so that the OR circuit calculates the logical sum of the control signals S1-Sn. The output of the OR circuit is introduced into a delay circuit R, so that the delay circuit R generates and outputs an off control signal E for the transistor Trp.

A dividing circuit A comprising resistors R1, R2, and R3 connected in series is connected to the terminal of the supply voltage VP. The transistor Trp is connected at the junction between the resistors R2 and R3. The transistor Trp is usually set in a ON-state (conductive) in relation with resistors R4 and R5, so that the resistor R3 become short-circuited. When the off control signal E from the delay circuit R is applied to the transistor Trp, the transistor Trp is set OFF (nonconductive), so that the resistor R3 is returned from the short-state to the operative condition.

The non-reverse (positive) input terminal of the comparison circuit CMP is connected between the resistors R1 and R2 of the dividing circuit A.

A reference voltage Vref which is generated and outputted from a reference voltage generator not shown in FIG. 3 is applied to the reverse (negative) input terminal of the comparison circuit CMP. Accordingly, the dividing circuit A and the transistor Trp form a comparison voltage level changing circuit.

The division ratio of the power source proportional voltage a, which is inputted into the comparison circuit CMP, to the supply voltage is changed in relation to the ON and OFF states of the transistor Trp.

According to the above power-off detection circuit, when all the plungers P1-Pn are not driven, the transistor Trp is set ON. Accordingly, a voltage developed by dividing a supply voltage VP with a division ratio R2/(R1+R2) is set as the power source proportional voltage a, and this power source proportional voltage a is applied to the non-reverse input terminal of the comparison circuit CMP.

Because the reference voltage Vref is much smaller than a power source proportional voltage a produced by the division of the above division ratio, the output terminal of the comparison circuit CMP is set and remains in a high level.

In this condition, if any of the control signals S1-Sn applied to the transistor Tr1-Tr2 are generated and outputted, the supply voltage VP decreases immediately by L, the (inductance)-component of the solenoids P1-Pn, and after a certain point, the supply voltage VP increases. In this time, if the division ratio of the dividing circuit A remains unchanged, the following operation occurs although the reference voltage Vref is constant.

In the event the power source proportional voltage a is decreased in accordance with the variation of the supply voltage VP the following occurs. Accordingly, when the level of the power source proportional voltage a become lower than that of the reference voltage Vref, the output terminal level of the comparison circuit CMP is set in the low level. But, when any one control signal S1-Sn is generated, the signal E for turning off the transistor Trp is generated and outputted through the OR circuit, the inverter IN, and the delay circuit R. Also, when the control signals S1-Sn are developed the transistor Trp is set after a short delay into off-state, so that the short-circuiting of the transistor R3 is released and the division ratio is set to (R2+R3)/(R1+R2+R3).

Figure 4:
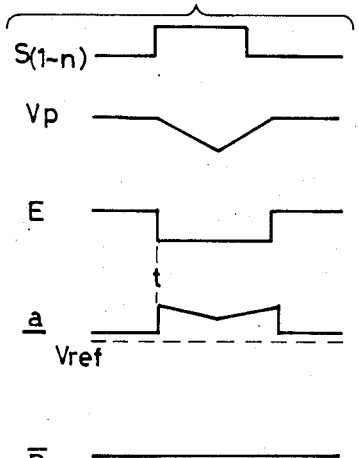
FIG. 4 shows a wave form chart of FIG. 3.

In the event the ratio of the power source proportional voltage a to the supply voltage VP is increased the following occurs. Accordingly, although the level of the power source proportional voltage a varies in accordance with the level variation of the supply voltage VP as shown in FIG. 4, the total level of the power source proportional voltage a is increased to a point t at which the level of the off control signal E is reduced. Thus, the power source proportional voltage a may not now be lower than the reference voltage Vref.

Thus, when any one control signals S1-Sn is set a high level, the division ratio of the division circuit A for preparing the power source proportional voltage a from the supply voltage is set larger, so that the level of the power source proportional voltage a is not lower than the reference voltage Vref.

In above embodiment, when the OR circuit outputs a high level signal, the division ratio of the power source proportional voltage a to the supply voltage VP is set higher. According to another embodiment of the present invention, when the OR circuit outputs a high level signal, the power source remains as it is, and the reference voltage Vref may be decreased only by a predetermined level.

According to above embodiment of the present invention, the output of the power-off signal produced by the variation of the supply voltage can be prevented, so that the power source capacity can be reduced. Also, the miniaturization and the lightening of the electronic apparatus may be accomplished as a power source capacity needed to operate the electronic apparatus can be reduced.

The invention being thus described, it will be obvious that the same may be varied in many ways. Such variations are not to be regarded as a departure from the spirit and scope of the invention, and all such modifications are intended to be included within the scope of the following claims.

What is claimed is:

1. Power-off detection means for use in an electronic apparatus having a power supply developing a supply voltage and at least one heavy load selectively connectable to said power supply in response to the generation of a control signal, said means comprising:
   means, responsive to said supply voltage, for determining whether said supply voltage drops below a reference level to thereby indicate that said power supply has been disconnected and for producing a power-off signal indicative thereof;
   means, responsive to generation of said control signal, for raising said reference level of said means for determining for a period of time so as to prevent said power-off signal from erroneously indicating a power-off condition when said heavy load is initially connected to said power supply.

2. Power-off detection means for use in an electronic apparatus having a power supply developing a supply voltage and at least one heavy load selectively connectable to said power supply in response to the generation of a control signal, said means comprising:
   voltage divider means, responsive to said supply voltage, for converting said supply voltage into a proportional voltage related to said power supply by a predetermined ratio;
   means, responsive to said proportional voltage, for comparing said proportional voltage to a reference voltage and developing a power-off signal when said proportional voltage drops below the level of said reference voltage;

heavy load connection compensation means, responsive to the generation of a said control signal, for varying the ratio of said voltage divider means to make said proportional voltage a greater proportion of said supply voltage to compensate for power supply loading caused by connection of a said heavy load to said power supply.

3. The power-off detection means of claim 2 wherein said heavy load connection compensation means includes heavy load connection detection means, responsive to said control signal, for sensing the connection of a said heavy load to said power supply and developing a heavy load connection signal indicative thereof; and means, responsive to said heavy load connection signal, for varying the ratio of said voltage divider means.

4. The power-off detection means of claim 3 wherein said electronic apparatus includes a plurality of heavy loads connectable to said power supply in response to the generation of one of a plurality of control signals, said power-off detection means further comprising OR circuit means for developing a heavy load connection signal when one of said control signals connects an associated heavy load to said power supply.

5. The power-off detection means of claim 3 wherein said voltage divider means includes first, second and third resistors serially connected between a voltage source and ground, said proportional voltage being developed at the junction between said first and second resistors.

6. The power-off detection means of claim 5 wherein said means for comparing includes a reference voltage source developing said reference voltage; and a comparator amplifier receiving said proportional voltage at a first input and said reference voltage at a second input thereof, said comparator amplifier having an output developing said power-off signal.

7. The power-off detection means of claim 3 wherein said means for varying comprises delay means, responsive to said heavy load connection signal for developing a prohibition signal for a predetermined time period; and ratio change means for changing the ratio of said voltage divider means so long as said prohibition signal is developed;

said prohibition signal being developed for a sufficient time to ensure that said power supply will return to its normal supply voltage after said heavy load is connected thereto.

8. The power-off detection means of claim 7 wherein said ratio change means includes switch means, responsive to prohibition means for connecting a point between said second and third resistors of said voltage divider means to ground so as to vary the ratio of said voltage divider means.

9. Power-off detection means for use in an electronic apparatus having a power supply developing a supply voltage and at least one heavy load selectively connectable to said power supply means in response to generation of a control signal, said means comprising:

means, responsive to said supply voltage, for determining whether said supply voltage drops below a reference level to thereby indicate that said power supply has been disconnected and for producing a power-off signal indicative thereof; and power-off signal prohibition means for inhibiting the generation of said power-off signal when said control signal is developed.

10. The power-off detection means of claim 9 wherein said prohibition means inhibits generation of said power-off signal by decreasing said reference level.

11. A method of detecting the disconnection of the power supply producing a supply voltage in an electronic apparatus having at least one heavy load selectively connectable thereto in response to a control signal comprising:

monitoring said supply voltage of said power supply and developing a monitored voltage indicative thereof;

comparing said monitored voltage to a reference voltage and developing a power-off output when said monitored voltage drops below said reference voltage; and inhibiting the power-off output for a period of time when a control signal is detected.

12. The method of claim 11 wherein said period of time is predetermined.

13. The method of claim 11 wherein said inhibiting lowers said reference voltage when said control signal is detected.

14. The method of claim 11 wherein a ratio of said monitored voltage to said supply voltage is increased when said control signal is detected.

* * * * *